United States Patent
Rhie

(10) Patent No.: US 7,965,468 B2
(45) Date of Patent: Jun. 21, 2011

(54) MAGNETIC RACETRACK MEMORY DEVICE INCLUDING WRITE-BACK LOOP

(75) Inventor: Hyoung-seub Rhie, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 212 days.

(21) Appl. No.: 12/469,047

(22) Filed: May 20, 2009

(65) Prior Publication Data
US 2009/0303631 A1    Dec. 10, 2009

(30) Foreign Application Priority Data
Jun. 9, 2008   (KR) .................. 10-2008-0053804

(51) Int. Cl.
*G11B 15/18*   (2006.01)
(52) U.S. Cl. .................. 360/69; 365/189.011; 365/80
(58) Field of Classification Search .................. None
See application file for complete search history.

(56) References Cited

U.S. PATENT DOCUMENTS

| | | | |
|---|---|---|---|
| 7,242,604 B2 | 7/2007 | Klaeui et al. | |
| 7,551,469 B1* | 6/2009 | Parkin | 365/80 |
| 7,825,445 B2* | 11/2010 | Covington | 257/295 |
| 2008/0080234 A1* | 4/2008 | Iwata et al. | 365/171 |

FOREIGN PATENT DOCUMENTS

| | | |
|---|---|---|
| JP | 2006005308 A | 1/2006 |
| JP | 2007073103 A | 3/2007 |
| KR | 1020040108684 A | 12/2004 |

* cited by examiner

*Primary Examiner* — Jason C Olson
(74) *Attorney, Agent, or Firm* — Volentine & Whitt, PLLC

(57) ABSTRACT

A magnetic racetrack memory device includes; a magnetic track having a plurality of magnetic domains partitioned by at least one magnetic domain wall, a current source applying current to the magnetic track sufficient to move the at least one magnetic domain wall and the plurality of magnetic domains along the magnetic track, a writing device disposed at a first location along the magnetic track and storing write data to the magnetic domains, a reading device disposed at a second location along the magnetic track and retrieving read data from the magnetic domains, and a write-back loop connecting the reading device and the writing device and communicating read data obtained by the reading device to the writing device.

18 Claims, 4 Drawing Sheets

MAGNETIC RACETRACK MEMORY DEVICE INCLUDING WRITE-BACK LOOP

CROSS-REFERENCE TO RELATED APPLICATIONS

This application claims the benefit of Korean Patent Application No. 10-2008-0053804 filed on Jun. 9, 2008, the subject matter of which is hereby incorporated by reference.

BACKGROUND

The inventive concept relates to a data storage device, and more particularly to a magnetic racetrack memory device that uses transfer of magnetic domains and magnetic domain walls.

Hard disk drives (HDDs) are data storage devices that allow the storage of "write data" on a rotating magnetic disk (or similar magnetic recording medium) via operation of a read/write head positioned over the magnetic recording medium. Upon subsequent demand, stored data may be retrieved as "read data" from the magnetic recording medium using the read/write head. Contemporary HDDs are high-density, nonvolatile data storage devices, and are generally implemented using a number of moving mechanical components and related electro-mechanical circuits. The increasing demand for denser data storage together with the relatively delicate nature of the moving mechanical components forming an HDD lead inexorably to problems associated with deterioration of mobility, accuracy of positioning and general reliability. Further, manufacturing complexity and corresponding costs, as well as concerns over power consumption and noise generation have negative competitive implications for conventional HDDs.

Accordingly, a number of recent development efforts have been directed to replacement data storage devices capable of providing commensurate data storage capabilities, but without all the complex, moving mechanical systems. One possible replacement device commonly referred to as the "magnetic racetrack memory device" uses a physics principle that recognizes that magnetic domains and magnetic domain walls move within a magnetic material (i.e., a magnetic body). One example of a known magnetic racetrack memory device is disclosed in published U.S. Patent Application 2004/0252538.

In general, conventional magnetic racetrack memory devices include a magnetic body constructed in a linear magnetic track shape of predetermined length. The magnetic track includes a plurality of magnetic domains which are partitioned by magnetic domain walls.

Unfortunately, in a conventional magnetic racetrack memory device, data cannot be written to an area corresponding to at least half of the magnetic track. That is, at least half of the magnetic track must be set aside as a buffer area. In the absence of this buffer area (although magnetic domains need to pass below a reading device in order to read information from the magnetic domains), some of the magnetic domains are moved outside an end of the magnetic track and corresponding data is lost.

SUMMARY

The inventive concept provides a magnetic racetrack memory device capable of reducing or preventing the significant loss of magnetic track area as an empty buffer area.

According to one embodiment, the inventive concept provides a magnetic racetrack memory device comprising; a magnetic track having a plurality of magnetic domains partitioned by at least one magnetic domain wall, a current source applying current to the magnetic track sufficient to move the at least one magnetic domain wall and the plurality of magnetic domains along the magnetic track, a writing device disposed at a first location along the magnetic track and storing write data to the magnetic domains, a reading device disposed at a second location along the magnetic track and retrieving read data from the magnetic domains, and a write-back loop connecting the reading device and the writing device and communicating read data obtained by the reading device to the writing device.

In one related aspect, the magnetic track comprises only a data region including magnetic domains capable of storing write data and does not comprise an empty buffer area designated to buffering the magnetic domains in the data area.

In another related aspect, the writing device re-writes the read data received from the write-back loop to the magnetic domains of the magnetic track. The writing device may be disposed at one end of the magnetic track, and the reading device may be disposed at another end of the magnetic track.

In another related aspect, the write-back loop may include a buffer to temporarily store the read data provided by the reading device.

In another related aspect, the magnetic racetrack memory device may further include a conversion circuit connected between the reading device and the write-back loop and configured to amplify an analog read data signal provided by the reading device, convert the analog read data signal to digital read data, and provide the digital read data to the write-back loop. The conversion circuit may include an amplifier amplifying the analog read data signal provided by the reading device and proving an output signal, an analog-to-digital converter (ADC) converting the output signal of the amplifier into the digital read data, a decoder decoding the digital read data and outputting the decoded digital read data to the write-back loop, and a cash memory temporarily storing the decoded digital read data and providing the stored decoded digital read data to an input/output device.

BRIEF DESCRIPTION OF THE DRAWINGS

Exemplary embodiments will be more clearly understood from the following detailed description made in conjunction with the accompanying drawings in which.

DESCRIPTION OF EMBODIMENTS

Figure 1:
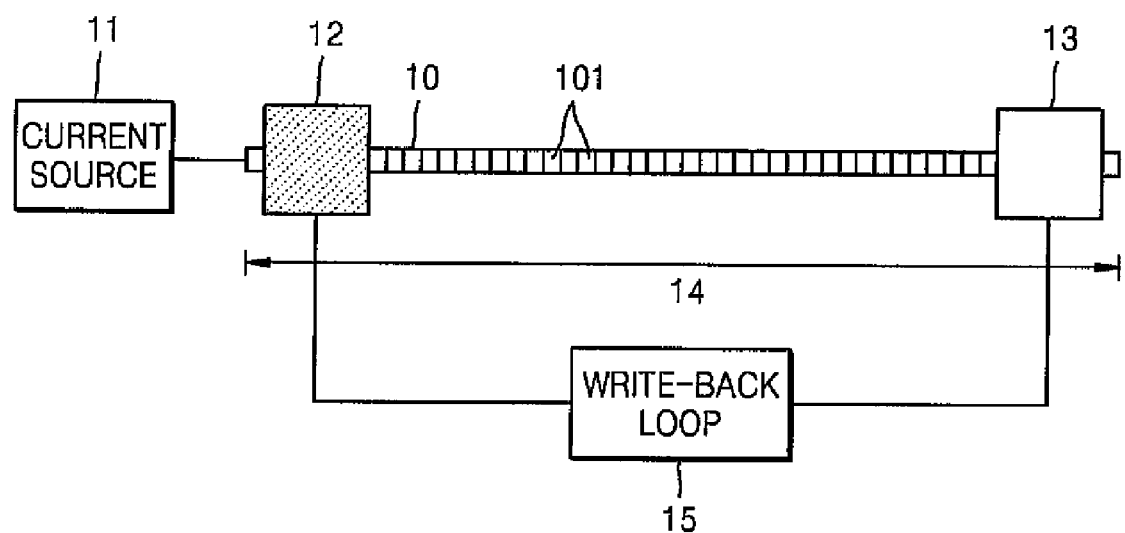
FIG. 1 schematically illustrates a magnetic racetrack memory device according to the inventive concept.

The inventive concept will now be described in some additional detail with reference to the accompanying drawings. Throughout the drawings and written description like reference numerals are used to indicate like or similar elements.

FIG. 1 schematically illustrates a magnetic racetrack memory device according to an embodiment of the inventive concept. Referring to FIG. 1, the magnetic racetrack memory device includes a magnetic track 10, a current source 11, a writing device 12, a reading device 13, and a write-back loop 15.

The magnetic track 10 includes a plurality of magnetic domains 101 partitioned by magnetic domain walls. The magnetic domains 101 denote magnetic fine regions that constitute a magnetic body, that is, the magnetic track 10. In each of the magnetic domains 101, the directions of magnetic moments are identical. The magnetic domain walls are boundaries between the magnetic domains having different magnetization directions, and the magnetic domain walls may be moved by an electrical current or magnetic field applied to the magnetic track 10.

The current source 11 applies a current to the magnetic track 10 in order to move the magnetic domain walls and the magnetic domains 101 along the magnetic track 10. For example, if the current source 11 applies a current to the magnetic track 10, which has a linear shape of predetermined length, in a first direction, the magnetic domain walls and the magnetic domains 101 in the magnetic track 10 may move in a direction opposite to the first direction, because the magnetic domain walls move in the direction of electron flow.

When the movement principle of the magnetic domain walls is applied to an information storage device, the movement of the magnetic domain walls allows the magnetic domains 101 to pass a fixed writing device 12 (e.g., a device similar to that of a write head for a conventional HDD) and a fixed reading device 13 (e.g., a device similar to that of a read head for a conventional HDD), whereby information may be written to and/or read from the magnetic domains 101.

The writing device 12 is installed at a predetermined location along the magnetic track 10, and writes information (i.e., write data) to the magnetic domains 101 when the magnetic domain walls and the magnetic domains 101 in the magnetic track 10 move. The reading device 13 is installed at a predetermined location along the magnetic track 10, and retrieves information as read data from of the magnetic domains 101 as a consequence of moved magnetic domain walls and the magnetic domains 101 in the magnetic track 10. In FIG. 1, the writing device 12 is installed proximate one end of the magnetic track 10, and the reading device 13 is installed proximate the other opposite end of the magnetic track 10. However, the writing device 12 and the reading device 13 may be disposed at any arbitrary locations along the magnetic track 10 as application demands.

The write-back loop 15 is connected between the reading device 13 and the writing device 12, and communicates read data obtained by the reading device 13 to the writing device 12.

Figure 2A:
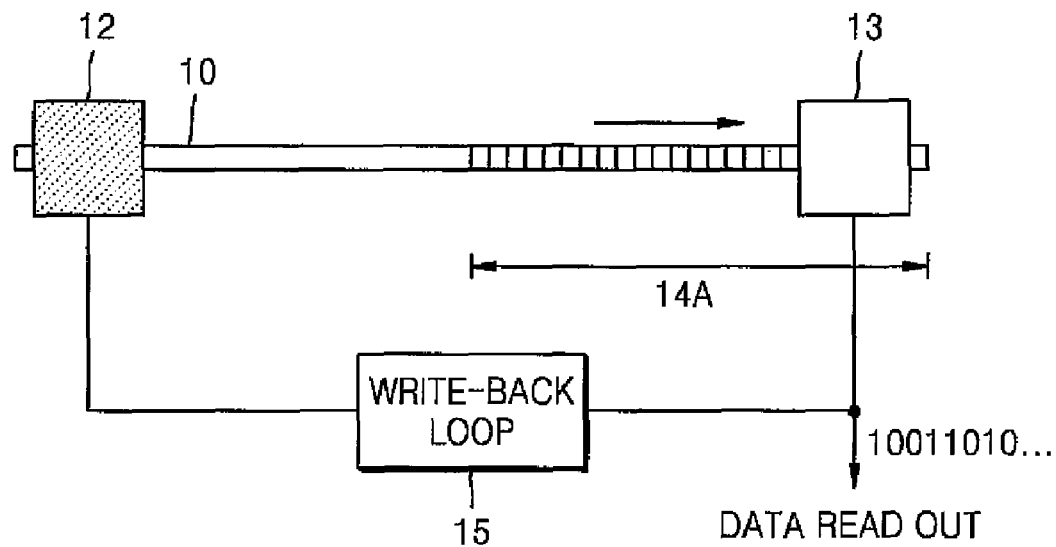
FIG. 2A is a view illustrating an operational principle of the magnetic racetrack memory device according to the inventive concept illustrated in FIG. 1.
Figure 2B:
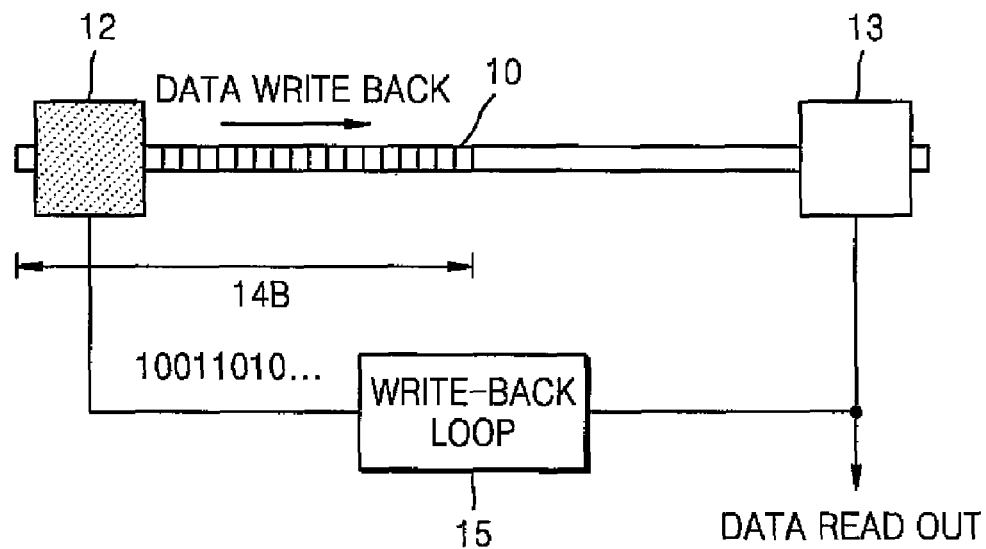
FIG. 2B is a view illustrating an operational principle of the magnetic racetrack memory device according to the inventive concept illustrated in FIG. 1.

FIGS. 2A and 2B are views illustrating some operating principles for the magnetic racetrack memory device according to embodiment illustrated in FIG. 1.

With reference to FIGS. 1, 2A and 2B, the magnetic track 10 is completely filled with write data (i.e., written to without significant empty areas) during previous write operations or during a load operation which is different from normal read/write operations. In other words, as illustrated in FIG. 1, following the write or load operations, the magnetic track 10 will continuously store data (i.e., store data without significant empty spaces) in a defined (first) data region 14A including magnetic domains 101. The empty buffer area conventionally necessary to buffer the magnetic domains 101 in relation to the data region 14 is not provided.

During a subsequent read operation, as illustrated in FIG. 2A, the magnetic domains 101 in the magnetic track 10 sequentially pass under the reading device 13, and reading device 13 reads information from the passing magnetic domains 101. At this time, information written to magnetic domains that are moved beyond the end of the magnetic track 10 and thus deviate from the defined magnetic track 10 is erased. Read data from the reading device 13, as illustrated in FIG. 2B, is communicated via the write-back loop 15 to the writing device 12, and re-written to the magnetic track 10 in a defined (second) data region 14B by the writing device 12.

In accordance with this operation, the magnetic racetrack memory device of FIG. 1 may be fully loaded with data and yet prevent the loss of read data. Due to the inclusion of the write-back loop 15 for preventing information loss, the magnetic track 10 does not need to include an empty buffer area.

It should be noted that in certain embodiments, the speed at which a read operation is performed by the reading device 13 may be less than the speed at which a write (or re-write) operation is performed by the writing device 12. In such cases, the write-back loop 15 may include a conventional data buffer for temporarily storing read data provided by the reading device 13.

Figure 3:
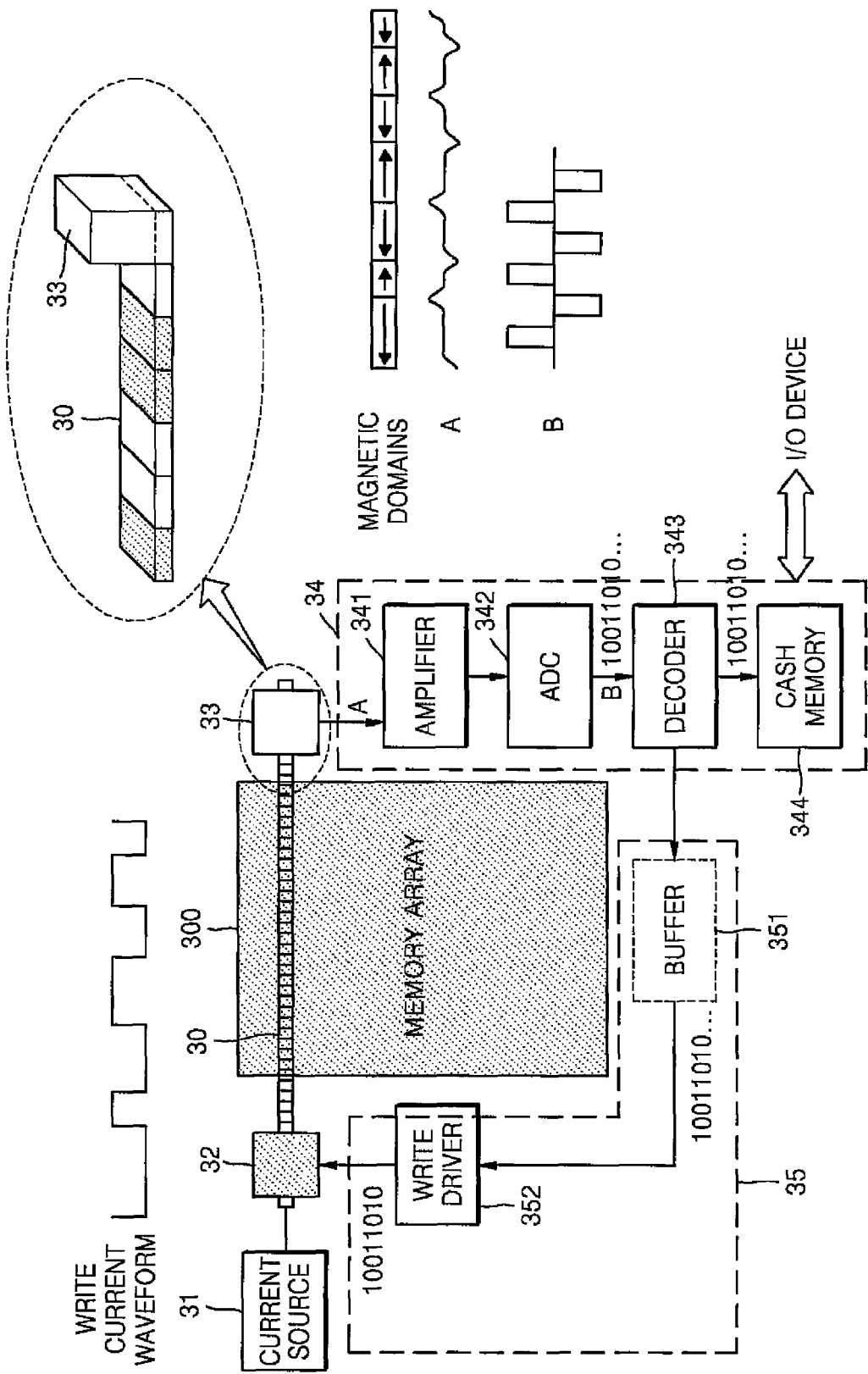
FIG. 3 illustrates another embodiment of the magnetic racetrack memory device according to the inventive concept.

FIG. 3 illustrates another embodiment of the inventive concept. Referring to FIG. 3, the magnetic racetrack memory device includes a plurality of magnetic tracks 30, a current source 31, a writing device 32, a reading device 33, a conversion circuit 34, and a write-back loop 35.

The plurality of magnetic tracks 30 may be arranged parallel to implement a memory array 300. The magnetic track 30, current source 31, writing device 32, reading device 33, and write-back loop 35 of FIG. 3 correspond respectively to the magnetic track 10, current source 11, writing device 12, reading device 13, and write-back loop 15 of FIG. 1.

A read path for the magnetic racetrack memory device of FIG. 3 is similar to that of a conventional HDD. Accordingly, the magnetic racetrack memory device of FIG. 3 has an arrangement of components in which the write-back loop 35 is added to a typical read path of a HDD. The conversion circuit 34, which generally corresponds to the read path of the magnetic racetrack memory device of FIG. 3, amplifies read data obtained by the reading device 33, converts the amplified read data into digital data, and then provides the digital read data to the write-back loop 35.

In the illustrated embodiment, the conversion circuit 34 comprises an amplifier 341, an analog-to-digital converter (ADC) 342, a decoder 343, and a cash memory 344. The amplifier 341 receives read data consistent with the magnetic domains in the magnetic track 30 by operation of the reading device 33, and amplifies the received read data. The ADC 342 converts an output signal from the amplifier 341 into digital read data. The decoder 343 decodes the digital read data and outputs the decoded digital read data (for example, 100110 10 . . . ) to the write-back loop 35. The cash memory 344 temporarily stores the decoded digital read data (for example, 10011010 . . . ) and outputs the stored digital read data to an external input/output (I/O) device.

In the illustrated embodiment, the structure of the magnetic racetrack memory device is divided into the read path and the write-back loop 35 after the decoder 343, because analog read signal "A" corresponding to the read data obtained from the magnetic domains of the magnetic track 30 by the reading device 33 is not a voltage signal having high and low levels but a signal that represents a peak only when the magnetization directions of adjacent magnetic domains are different and has no change when the magnetization directions of adjacent magnetic domains are identical. In other words, the analog read signal "A" needs to be converted into a corresponding voltage signal (for example, 10011010 . . . ) having high and low levels corresponding to 0 and 1 so as to be easily used in the write-back loop 35.

The write-back loop 35 includes a read data buffer 351 and a write driver 352. The read data buffer 351 buffers the decoded digital read data (for example, 10011010 . . . ) provided by the decoder 343. The write driver 352 receives stored read data from the read data buffer 351 and outputs the read data to the writing device 32.

As described above, if the speed of a read operation performed by reading device 33 is different from the speed of the write operation performed by the writing device 33, the buffer 351 will temporarily store read data. Otherwise, the buffer 351 will not be needed and may be omitted from certain embodiments of the inventive concept. If the buffer 351 is not included, the write driver 352 directly receives the decoded digital read data (for example, 10011010 . . . ) from the decoder 343 and outputs the decoded digital data to the writing device 32.

Although the magnetic racetrack memory device of FIG. 3 includes the conversion circuit 34, it need not include this circuit. If the conversion circuit 34 is not included, the read data obtained by the reading device 33 may be directly provided to the writing device 32 via the write-back loop 35. The writing device 32 then re-writes the information received via the write-back loop 35 to the magnetic track 10.

Figure 4:
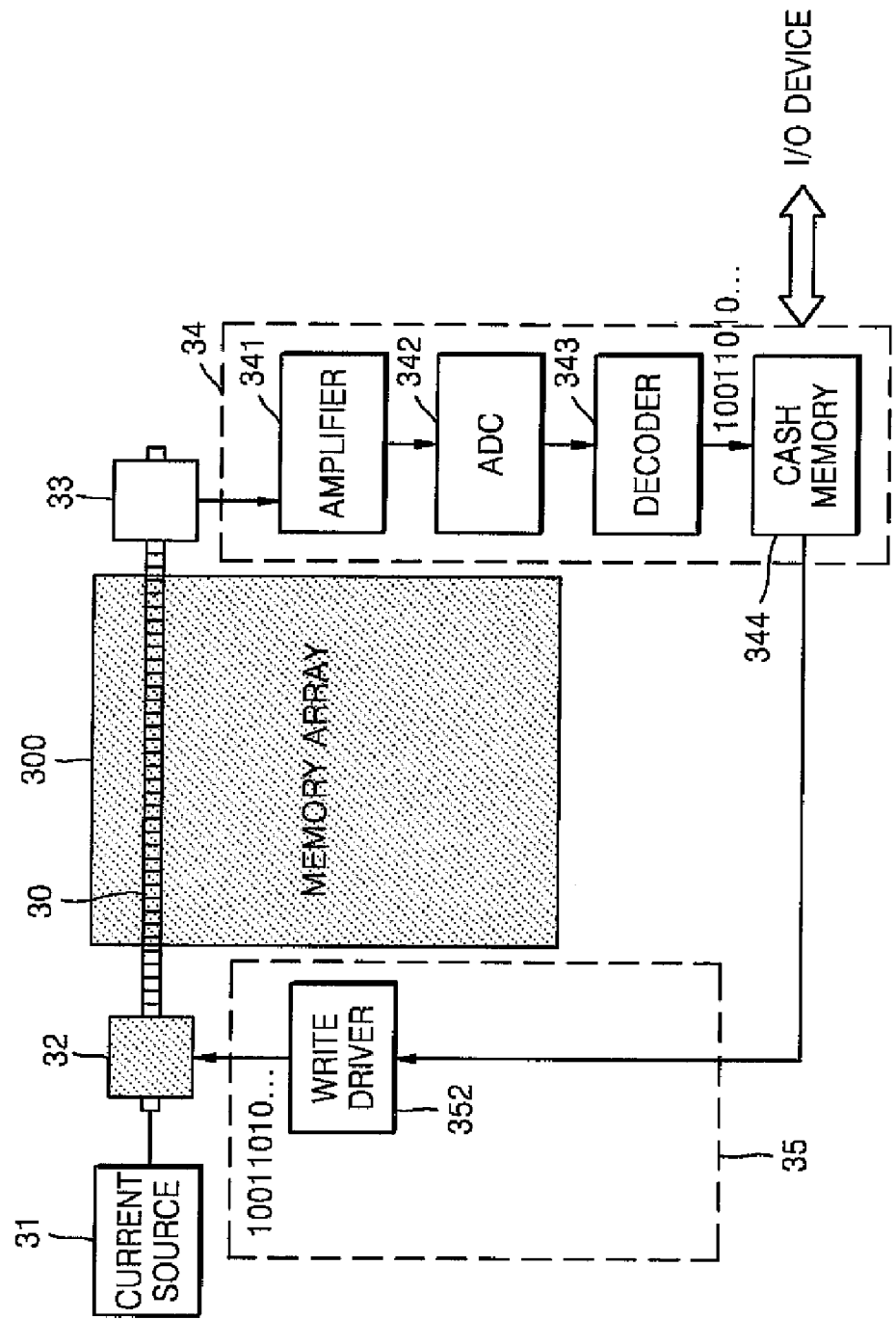
FIG. 4 illustrates yet another embodiment of the magnetic racetrack memory device according to the inventive concept.

FIG. 4 illustrates another embodiment of the magnetic racetrack memory device according to an embodiment of the inventive concept.

In the magnetic racetrack memory device of FIG. 4, the write-back loop 35 does not include a buffer, but a cash memory 344 in the conversion circuit 34 is used as a buffer. That is, the magnetic racetrack memory device of FIG. 4 is the same as that of FIG. 3 except that the cash memory 344 in the conversion circuit 34 is used as a buffer. Accordingly, a detailed description of the duplicate components of the magnetic racetrack memory device of FIG. 4 will be omitted.

As noted above, a magnetic racetrack memory device according to an embodiment of the inventive concept does not require a significant empty buffer area within a constituent magnetic track. However, the conventional data loss necessitating the use conventional use of the empty buffer area is prevented by use of a write-back loop.

While the inventive concept has been particularly shown and described with reference to exemplary embodiments thereof, it will be understood that various changes in form and details may be made therein without departing from the scope of the following claims.

What is claimed is:

1. A magnetic racetrack memory device comprising:
   a magnetic track having a plurality of magnetic domains partitioned by at least one magnetic domain wall;
   a current source applying current to the magnetic track sufficient to move the at least one magnetic domain wall and the plurality of magnetic domains along the magnetic track;
   a writing device disposed at a first location along the magnetic track and storing write data to the magnetic domains;
   a reading device disposed at a second location along the magnetic track and retrieving read data from the magnetic domains; and
   a write-back loop connecting the reading device and the writing device and communicating read data obtained by the reading device to the writing device.

2. The magnetic racetrack memory device of claim 1, wherein the magnetic track comprises only a data region including magnetic domains capable of storing write data and does not comprise an empty buffer area designated to buffering the magnetic domains in the data area.

3. The magnetic racetrack memory device of claim 1, wherein the writing device re-writes the read data received from the write-back loop to the magnetic domains of the magnetic track.

4. The magnetic racetrack memory device of claim 1, wherein the writing device is disposed at one end of the magnetic track, and the reading device is disposed at another end of the magnetic track.

5. The magnetic racetrack memory device of claim 1, wherein the write-back loop comprises a buffer to temporarily store the read data provided by the reading device.

6. The magnetic racetrack memory device of claim 1, further comprising:
   a conversion circuit connected between the reading device and the write-back loop and configured to amplify an analog read data signal provided by the reading device, convert the analog read data signal to digital read data, and provide the digital read data to the write-back loop.

7. The magnetic racetrack memory device of claim 6, wherein the conversion circuit comprises:
   an amplifier amplifying the analog read data signal provided by the reading device and proving an output signal;
   an analog-to-digital converter (ADC) converting the output signal of the amplifier into the digital read data;
   a decoder decoding the digital read data and outputting the decoded digital read data to the write-back loop; and
   a cash memory temporarily storing the decoded digital read data and providing the stored decoded digital read data to an input/output device.

8. The magnetic racetrack memory device of claim 1, wherein the write-back loop comprises:
   a buffer buffering the read data provided by the reading device and providing an output signal; and
   a write driver receiving the output signal of the buffer and providing the output signal to the writing device.

9. The magnetic racetrack memory device of claim 7, wherein the write-back loop comprises:
   a buffer buffering the read data provided by the reading device and providing an output signal; and
   a write driver receiving the output signal of the buffer and providing the output signal to the writing device.

10. The magnetic racetrack memory device of claim 1, wherein the write-back loop comprises a write driver receiving the read data provided by the reading device and providing the read data to the writing device.

11. The magnetic racetrack memory device of claim 7, wherein the write-back loop comprises a write driver receiving the read data provided by the reading device and providing the read data to the writing device.

12. The magnetic racetrack memory device of claim 6, wherein the write-back loop comprises a write driver receiving the read data provided by the reading device and providing the read data to the writing device.

13. The magnetic racetrack memory device of claim 1, wherein the first location is different from the second location.

14. The magnetic racetrack memory device of claim 1, wherein the magnetic track comprises a plurality of magnetic tracks arranged in parallel, each one of the plurality of magnetic tracks having a plurality of magnetic domains partitioned by at least one magnetic domain wall.

15. The magnetic racetrack memory device of claim 14, wherein the each one of the plurality of magnetic tracks comprises only a data region including magnetic domains capable of storing write data and does not comprise an empty buffer area designated to buffering the magnetic domains in the data area.

16. The magnetic racetrack memory device of claim 14, wherein the writing device re-writes the read data received from the write-back loop to the magnetic domains of the magnetic track.

17. The magnetic racetrack memory device of claim 14, wherein the writing device is disposed at one end of the magnetic track, and the reading device is disposed at another end of the magnetic track.

18. The magnetic racetrack memory device of claim 14, wherein the write-back loop comprises a buffer to temporarily store the read data provided by the reading device.

* * * * *